(12) United States Patent
Wakiyama

(10) Patent No.: US 12,412,847 B2
(45) Date of Patent: Sep. 9, 2025

(54) SEMICONDUCTOR MODULE, SEMICONDUCTOR DEVICE AND VEHICLE

(71) Applicant: Fuji Electric Co., Ltd., Kanagawa (JP)

(72) Inventor: Tomoyuki Wakiyama, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 413 days.

(21) Appl. No.: 18/163,486

(22) Filed: Feb. 2, 2023

(65) Prior Publication Data

US 2023/0290741 A1 Sep. 14, 2023

(30) Foreign Application Priority Data

Mar. 14, 2022 (JP) .................................. 2022-039505

(51) Int. Cl.
*H01L 23/00* (2006.01)
*H01L 23/15* (2006.01)
*H01L 23/31* (2006.01)

(52) U.S. Cl.
CPC ............ *H01L 23/562* (2013.01); *H01L 23/15* (2013.01); *H01L 23/3121* (2013.01)

(58) Field of Classification Search
CPC ... H01L 23/562; H01L 23/15; H01L 23/3121; H01L 23/057
See application file for complete search history.

(56) References Cited

U.S. PATENT DOCUMENTS

| | | | | |
|---|---|---|---|---|
| 7,808,100 | B2 * | 10/2010 | Bayerer | H01L 25/072 |
| | | | | 257/E23.101 |
| 11,239,131 | B2 * | 2/2022 | Wakiyama | H01L 23/49844 |
| 11,637,049 | B2 * | 4/2023 | Wakiyama | H01L 23/04 |
| | | | | 257/690 |
| 2009/0261472 | A1 * | 10/2009 | Bayerer | H01L 24/06 |
| | | | | 257/E23.101 |
| 2020/0286840 | A1 * | 9/2020 | Kaji | H01L 25/18 |
| 2021/0111092 | A1 * | 4/2021 | Wakiyama | H01L 23/367 |
| 2022/0068748 | A1 * | 3/2022 | Wakiyama | H01L 23/36 |
| 2022/0293547 | A1 * | 9/2022 | Li | H01L 23/5389 |
| 2023/0067725 | A1 * | 3/2023 | Morozumi | H01L 23/562 |

(Continued)

FOREIGN PATENT DOCUMENTS

| | | | | |
|---|---|---|---|---|
| CN | 111512434 A | * | 8/2020 | ......... H01L 21/4807 |
| CN | 111668165 A | * | 9/2020 | ............. H01L 23/14 |

(Continued)

*Primary Examiner* — Laura M Menz
(74) *Attorney, Agent, or Firm* — CHEN YOSHIMURA LLP

(57) ABSTRACT

A semiconductor module includes: a wiring board including a ceramic substrate and conductor patterns on a first surface of the ceramic substrate; a semiconductor element arranged on at least one of the conductor patterns on the first surface of the ceramic substrate; a sealing insulator that seals the wiring board and the semiconductor element; and an insulating member disposed on the first surface of the ceramic substrate in a gap between the conductor patterns that are adjacent to each other, the insulating member extending in an extending direction of the gap and dividing an area in the gap where the sealing insulator fills the gap so that the insulating member is separate from respective edges of the conductor patterns adjacent to each other.

13 Claims, 11 Drawing Sheets

(56) References Cited

U.S. PATENT DOCUMENTS

| | | | | |
|---|---|---|---|---|
| 2023/0120152 A1* | 4/2023 | Murata | ............ | H01L 23/04 |
| | | | | 257/734 |
| 2023/0290741 A1* | 9/2023 | Wakiyama | .............. | H01L 23/60 |
| 2024/0145353 A1* | 5/2024 | Nakamura | ......... | H01L 23/49551 |
| 2024/0312899 A1* | 9/2024 | Nakagome | .............. | H01L 25/07 |
| 2025/0070057 A1* | 2/2025 | Ichikawa | ................ | H01L 23/36 |
| 2025/0112129 A1* | 4/2025 | Kanai | ............... | H01L 23/49534 |
| 2025/0140625 A1* | 5/2025 | Yasuda | ................... | H01L 21/56 |
| 2025/0149496 A1* | 5/2025 | Kato | ....................... | H01L 24/37 |

FOREIGN PATENT DOCUMENTS

| | | | | | |
|---|---|---|---|---|---|
| CN | 112640095 | A | * | 4/2021 | |
| CN | 114026748 | A | * | 2/2022 | ............ H01L 23/142 |
| CN | 111512434 | B | * | 8/2023 | ......... H01L 21/4807 |
| CN | 111668165 | B | * | 8/2023 | ............. H01L 23/14 |
| CN | 112956040 | B | * | 1/2024 | ........... H01L 23/045 |
| CN | 114026748 | B | * | 5/2024 | ........... H01L 23/142 |
| CN | 112640095 | B | * | 10/2024 | |
| CN | 118866827 | A | * | 10/2024 | |
| DE | 69923374 | T2 | * | 1/2006 | ............. H01L 23/24 |
| DE | 102009002191 | A1 | * | 10/2010 | ............. H01L 23/04 |
| DE | 102013206963 | A1 | * | 11/2014 | ............. H01L 33/483 |
| DE | 112023000279 | T5 | * | 10/2024 | ....... H01L 23/49861 |
| EP | 3712933 | A1 | * | 9/2020 | ........ H01L 21/4807 |
| JP | 2000036550 | A | * | 2/2000 | |
| JP | 2002190569 | A | * | 7/2002 | |
| JP | 2003224236 | A | * | 8/2003 | |
| JP | 2006066427 | A | * | 3/2006 | |
| JP | 2006100446 | A | * | 4/2006 | ......... B81C 1/00269 |
| JP | 2009017751 | A | * | 1/2009 | |
| JP | 2013135077 | A | * | 7/2013 | |
| JP | 2015041676 | A | * | 3/2015 | |
| JP | 6205686 | B2 | * | 10/2017 | |
| JP | 2019145612 | A | * | 8/2019 | ......... H01L 21/4807 |
| JP | 2020035824 | A | * | 3/2020 | |
| JP | 2020068261 | A | * | 4/2020 | ............ H01L 23/045 |
| JP | 2020145285 | A | * | 9/2020 | ............. H01L 23/14 |
| JP | 2021005458 | A | * | 1/2021 | ............ H01L 23/142 |
| JP | 2021007179 | A | * | 1/2021 | |
| JP | 2021064707 | A | * | 4/2021 | ............. H01L 23/10 |
| JP | 7083256 | B2 | * | 6/2022 | ......... H01L 21/4807 |
| JP | 7142517 | B2 | * | 9/2022 | |
| JP | 7163828 | B2 | * | 11/2022 | ............. H01L 23/14 |
| JP | 2023031825 | A | * | 3/2023 | ............ H01L 23/053 |
| JP | 2023134143 | A | * | 9/2023 | ............. H01L 23/15 |
| JP | 2024068929 | A | * | 5/2024 | |
| WO | WO-2019008828 | A1 | * | 1/2019 | ............. H01L 21/54 |
| WO | WO-2019159798 | A1 | * | 8/2019 | ......... H01L 21/4807 |
| WO | WO-2020044656 | A1 | * | 3/2020 | |
| WO | WO-2020085154 | A1 | * | 4/2020 | ............ H01L 23/045 |
| WO | WO-2020195142 | A1 | * | 10/2020 | |
| WO | WO-2020262030 | A1 | * | 12/2020 | ........... H01L 23/142 |
| WO | WO-2021059904 | A1 | * | 4/2021 | ............. B05D 3/065 |
| WO | WO-2024004383 | A1 | * | 1/2024 | ....... H01L 23/49861 |

* cited by examiner

SEMICONDUCTOR MODULE, SEMICONDUCTOR DEVICE AND VEHICLE

BACKGROUND OF THE INVENTION

Technical Field

The present invention relates to a semiconductor module, a semiconductor device, and a vehicle.

Background Art

A type of a semiconductor module has a substrate provided with semiconductor elements such as IGBT (Insulated Gate Bipolar Transistor), Power MOSFET (Metal Oxide Semiconductor Field Effect Transistor), FWD (Free Wheeling Diode), etc., and is used in inverter devices, etc.

In this type of semiconductor module, a semiconductor element is mounted on a wiring board having conductor patterns using copper or the like on a surface of a ceramic substrate, and the wiring board with the semiconductor element mounted thereon is housed by a resin case provided with external terminals. The electrodes of the semiconductor element housed in the resin case are connected to the conductor patterns of the wiring board and the external terminals of the resin case by means of conductor materials for wiring such as leads and bonding wires. The semiconductor element in the resin case and the conductor pattern of the wiring board are sealed with an insulating resin such as epoxy resin, for example. In such a semiconductor module, insulation between the conductor patterns provided on the surface of the ceramic substrate is secured by an insulating resin for sealing, thereby narrowing the distance (gap) between the conductor patterns and miniaturizing the semiconductor module.

In a semiconductor module using a ceramic substrate, thermal stress resulting from heat generation of a semiconductor element during operation may cause bending deformation of the ceramic substrate, resulting in cracks or the like. As a technique for preventing deterioration in the reliability of a semiconductor module due to such thermal stress, Patent Document 1 discloses a ceramic circuit board that is reinforced with an insulating material along the surface of the ceramic substrate between adjacent conductor patterns.

RELATED ART DOCUMENT

Patent Document

Patent Document 1: Japanese Patent Application-Laid-Open Publication No. 2000-036550

SUMMARY OF THE INVENTION

In the semiconductor module described above, the insulation between the conductor patterns provided on the surface of the ceramic substrate is achieved by closely contacting the exposed portions (gap portions) between the conductor patterns on the surface of the ceramic substrate with a single insulating resin. In such a semiconductor module, if delamination occurs at the interface between the ceramic substrate and the insulating resin due to thermal stress caused by heat generated by the semiconductor elements during operation, the delamination may spread over the entire gap between the conductor patterns, and insulation between the conductor patterns may not be ensured. Therefore, it is difficult to further reduce the size of the semiconductor module by narrowing the distance (gap) between the conductor patterns.

An object of the present invention is to provide a semiconductor module, a semiconductor device, and a vehicle capable of ensuring insulation between adjacent conductor patterns on a surface of a ceramic substrate.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor module comprising: a wiring board including a ceramic substrate and conductor patterns on a first surface of the ceramic substrate; a semiconductor element arranged on at least one of the conductor patterns on the first surface of the ceramic substrate; a sealing insulator that seals the wiring board and the semiconductor element; and an insulating member adhered on the first surface of the ceramic substrate in a gap between the conductor patterns that are adjacent to each other, the insulating member extending in an extending direction of the gap and dividing an area in the gap where the sealing insulator fills the gap so that the insulating member is laterally separate from respective edges of the conductor patterns adjacent to each other.

According to the present invention, it is possible to ensure insulation between adjacent conductor patterns on the surface of the ceramic substrate.

Here, the insulating member may be adhered to said ceramic substrate with an insulating adhesive.

The insulating member may have a fin portion projecting laterally at or adjacent to a top portion of the insulating member that is at a far end from the first surface of the ceramic substrate.

The insulating member may have a fin portion protruding laterally at or adjacent to a bottom portion of the insulating member that is attached to the first surface of the ceramic substrate.

The insulating member may be a single member. Alternatively, the insulating member may be formed by combining a plurality of separately provided separation portions.

The plurality of separately provided separation portions may include a first separation portion extending in a first direction and a second separation portion extending from the first separation portion in a second direction different from the first direction, and an interface line of a connection portion between the first separation portion and the second separation portion on the first surface of the ceramic substrate may be longer than a straight line connecting both ends of the interface line of the connection portion.

The interface line may have a stepped shape having a straight segment extending in the first direction and a straight segment extending in the second direction.

On the first surface of the ceramic substrate, a height of the insulating member may be smaller than a height of the conductor patterns.

In another aspect, the present disclosure provides a semiconductor device, comprising the above-described semiconductor module an a cooler provided on a second surface of the ceramic substrate that is opposite to the first surface. A vehicle may include the above-described semiconductor module. A vehicle may include the above-described semiconductor device.

It is to be understood that both the foregoing general description and the following detailed description are exemplary and explanatory, and are intended to provide further explanation of the invention as claimed.

DETAILED DESCRIPTION OF EMBODIMENTS

Hereinafter, embodiments of a semiconductor device according to the present invention will be described in detail with reference to the drawings. It should be noted that the X, Y, and Z axes in each drawing to be referred to are shown for the purpose of defining planes and directions in the illustrated semiconductor device, etc., and the X, Y, and Z axes are orthogonal to each other, forming the right-hand coordinate system. In the following description, the X direction may be referred to as the left-right direction, the Y direction as the front-rear direction, and the Z direction as the up-down direction. A plane including the X axis and the Y axis may be called an XY plane, a plane including the Y axis and the Z axis may be called a YZ plane, and a plane including the Z axis and the X axis may be called a ZX plane. These directions (front, back, left, right, up and down) and planes are terms used for convenience of explanation, and depending on the mounting posture of the semiconductor device, the corresponding relationship with each of the XYZ directions may change. For example, the heat radiation side (cooler side) of the semiconductor device is called the bottom side, and the opposite side is called the top side. Further, in this specification, a plan view means a case in which the upper surface or the lower surface (XY plane) of the semiconductor device or the like is viewed from the Z direction. Further, the aspect ratio and the size relationship among respective members in each drawing are only schematically represented, and do not necessarily correspond to the relationship in an actually manufactured semiconductor device or the like. For convenience of explanation, it may be assumed that the size relationship between each member is exaggerated.

Also, the semiconductor device illustrated in the following description is applied to a power conversion device such as an inverter for an industrial or vehicle-mounted motor, for example. Therefore, in the following description, detailed descriptions of the same or similar configurations, functions, operations, and the like as those of known semiconductor devices are omitted.

Figure 1:
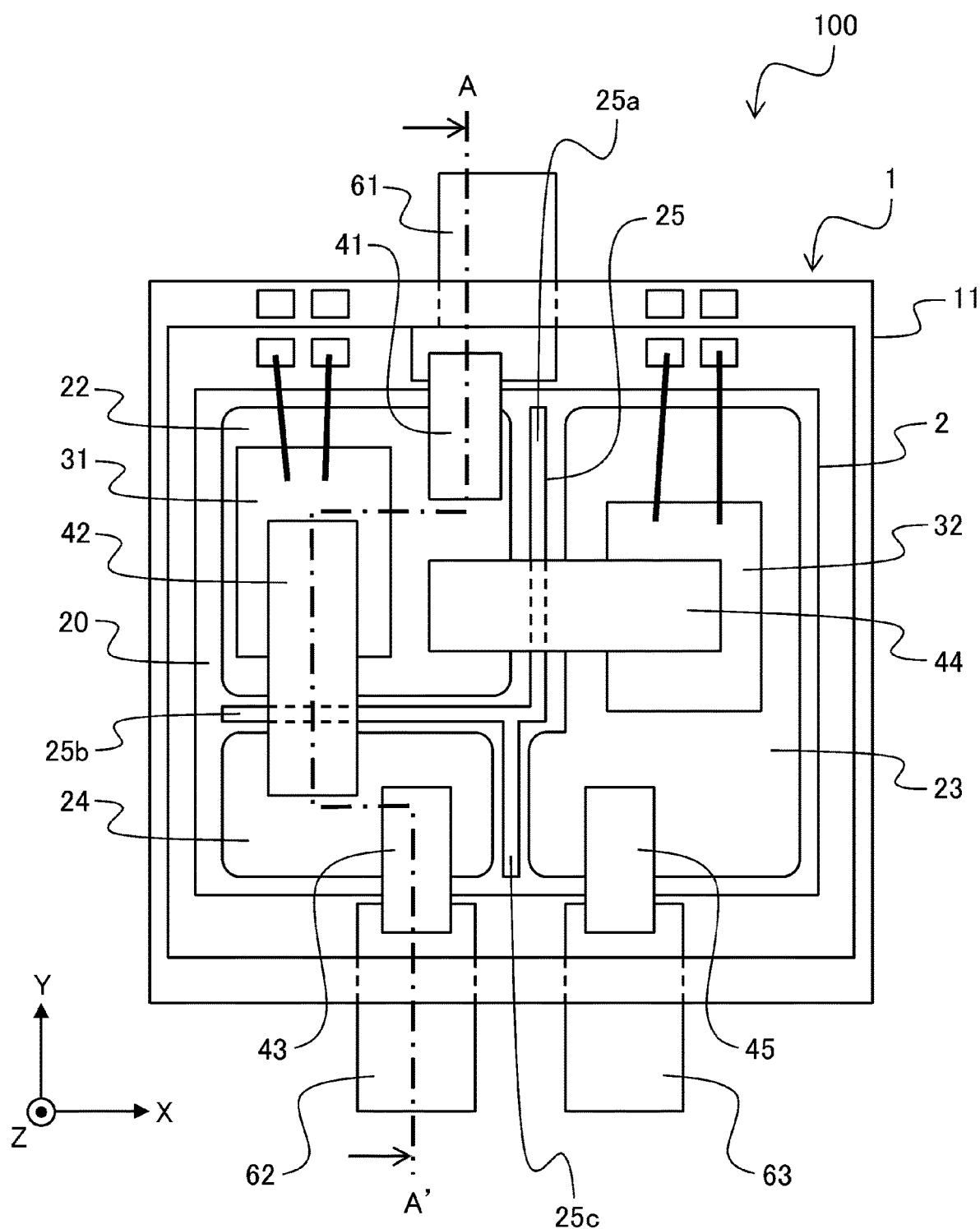
FIG. 1 is a top view showing a configuration example of a semiconductor device according to an embodiment.
Figure 2:
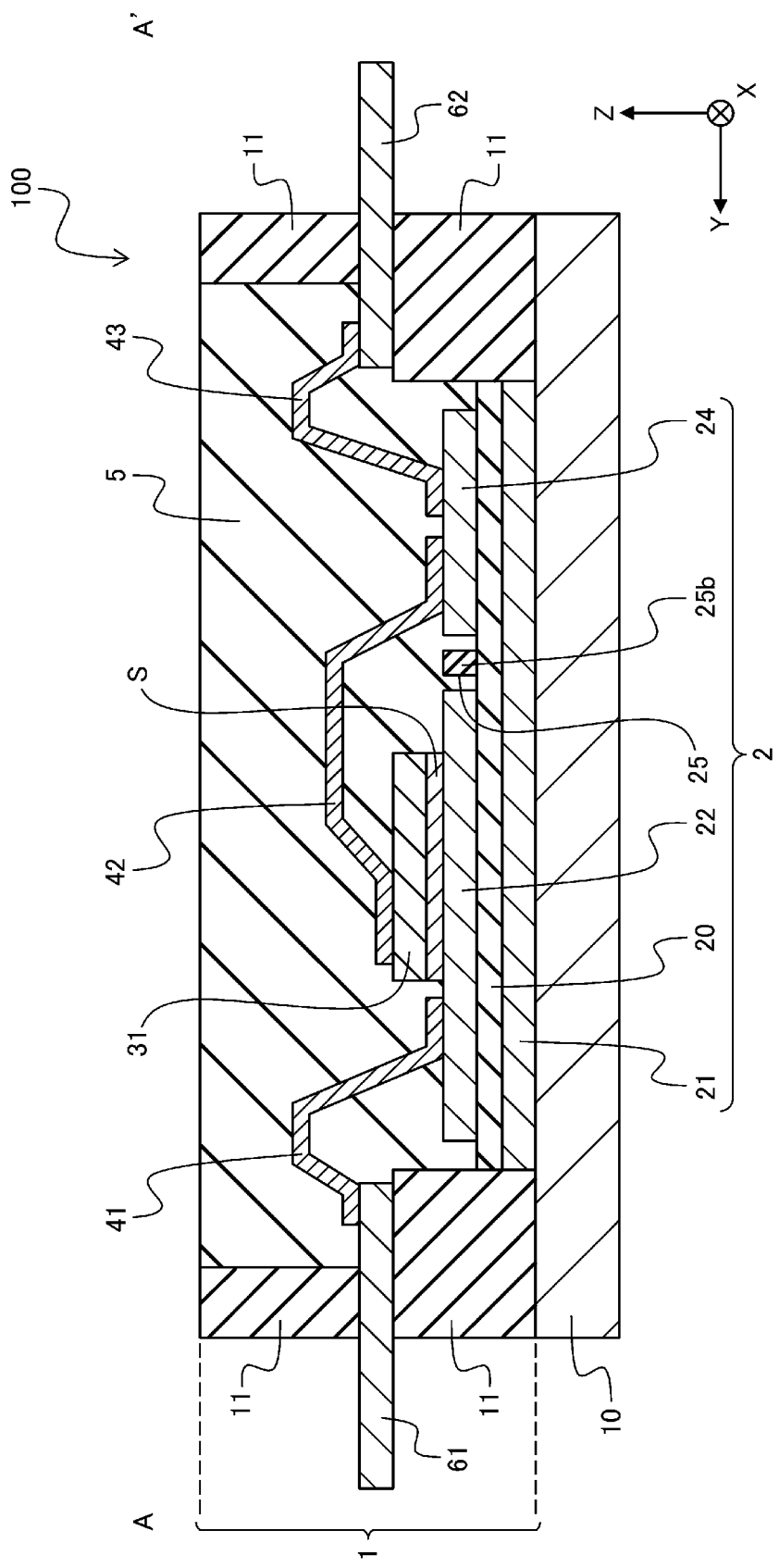
FIG. 2 is a cross-sectional view of the semiconductor device of FIG. 1 taken along the line A-A'.
Figure 3:
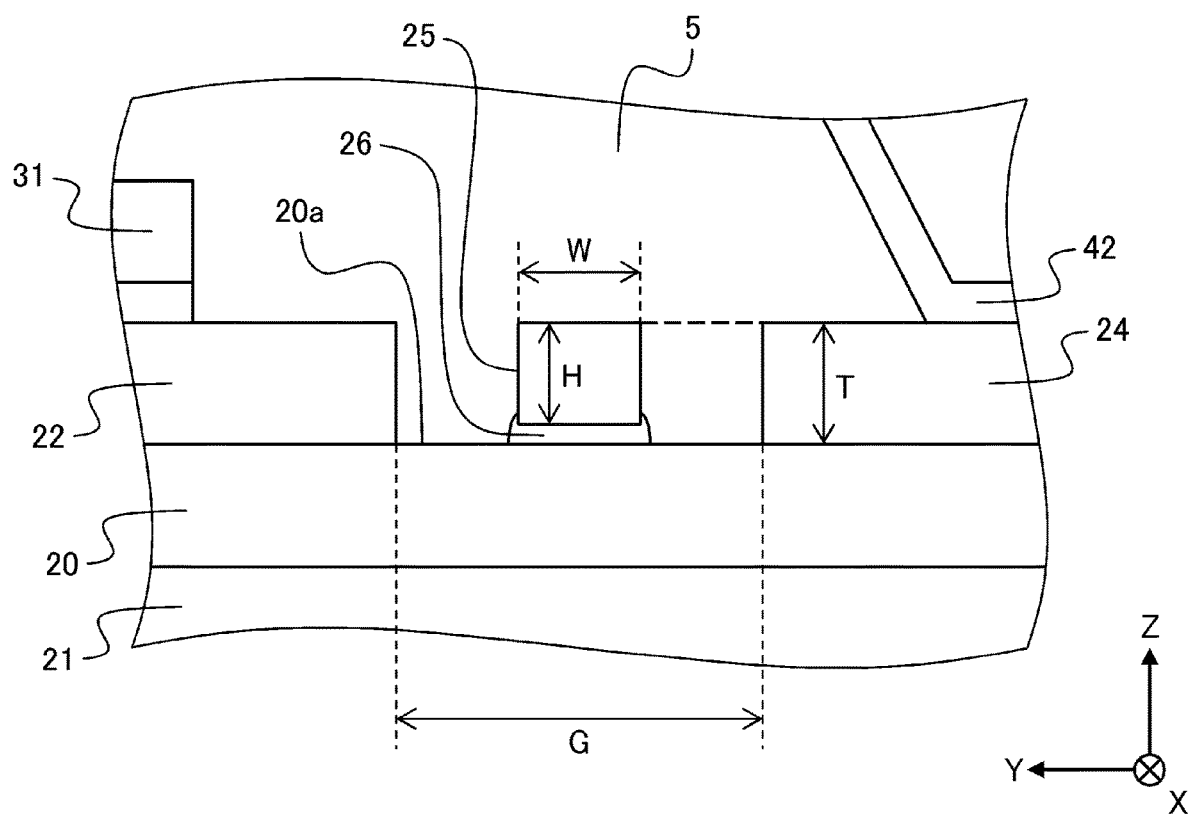
FIG. 3 is a partial cross-sectional view enlarging the main part in the cross-sectional view of FIG. 2.

FIG. 1 is a top view showing a configuration example of a semiconductor device according to one embodiment. FIG. 2 is a cross-sectional view of the semiconductor device of FIG. 1 taken along the line A-A'. FIG. 3 is a partial cross-sectional view enlarging a main part in the cross-sectional view of FIG. 2. In FIG. 3, hatching indicating a cross section of an object (rigid body) is omitted.

As illustrated in FIGS. 1 and 2, the semiconductor device 100 according to the present embodiment is configured by arranging the semiconductor module 1 on the upper surface of the cooler 10. Note that the cooler 10 has an appropriate configuration with respect to the semiconductor module 1.

The cooler 10 releases the heat of the semiconductor module 1 to the outside, and has a rectangular parallelepiped shape as a whole. Although not particularly illustrated, the cooler 10 is configured by providing a plurality of fins on the lower surface side of a base plate and by housing these fins in a water jacket. Note that the cooler 10 is not limited to this configuration and can be modified as appropriate.

The semiconductor module 1 is configured by arranging a multilayer substrate 2, a semiconductor element 32, metal wiring plates 42-45, and the like in a case 11.

The multilayer substrate 2 can be, for example, a DCB (Direct Copper Bonding) substrate or an AMB (Active Metal Brazing) substrate. The multilayer substrate 2 includes a ceramic substrate 20, a radiator plate 21, and a plurality of conductor plates (conductor patterns) (in FIG. 1, a first conductor plate 22, a second conductor plate 23, and a third conductor plate 24). and is formed in a rectangular shape in a plan view as a whole. The multilayer substrate 2 is an example of a wiring board in which conductor patterns are provided on a first surface of a ceramic substrate.

The ceramic substrate 20 is a rectangular insulating member having an upper surface (first surface) 20a and a lower surface. The ceramic substrate 20 is made of a ceramic material such as aluminum oxide ($Al_2O_3$), aluminum nitride (AlN), silicon nitride ($Si_3N_4$), aluminum oxide ($Al_2O_3$) and zirconium oxide ($ZrO_2$).

A radiator plate 21 is arranged on the lower surface of the ceramic substrate 20. The radiator plate 21 has substantially the same rectangular shape as the ceramic substrate 20 in a plan view. The radiator plate 21 is made of, for example, a metal plate with good thermal conductivity such as copper or aluminum. The lower surface of the radiator plate 21 is a mounting surface for the cooler 10 to which the semiconductor module 1 is attached, and also functions as a heat radiation surface (heat radiation area) for releasing heat from the semiconductor module 1. The radiator plate 21 is bonded to the upper surface of the cooler 10 via a bonding material (not shown) such as solder. The radiator plate 21 may be arranged on the upper surface of the cooler 10 via a thermally conductive material such as thermal grease or thermal compound.

A plurality of conductor plates (conductor patterns) are arranged on the upper surface of the ceramic substrate 20. In the multilayer substrate 2 illustrated in FIG. 1, on the upper surface 20a of the ceramics substrate 20, a first conductor plate 22, a second conductor plate 23, and a third conductor plate 24 are arranged with predetermined gaps so that they do not overlap each other. Each of the plurality of conductor plates has a predetermined thickness and is formed as an electrically independent island. The first conductor plate 22 and the third conductor plate 24 each have a substantially rectangular shape in a plan view, and are arranged side by side in the Y direction on the upper surface of the ceramics substrate 20. The second conductor plate 23 has a substantially inverted L shape in a plan view, and is arranged on the upper surface of the ceramic substrate 20 to the right of the first conductor plate 22 and the third conductor plate 24 (positive side in the X direction).

The number of the conductor plates is not limited to three, and can be changed as appropriate. Moreover, the shape of the conductor plate, the arrangement position, etc., can be changed as appropriate without being limited to these. These conductor plates are made of metal plates with good thermal conductivity, such as copper and aluminum. The conductor plate may be called a conductor layer or a conductor pattern.

Further, in the semiconductor module 1 according to the present embodiment, a separating insulating member 25 extending along the extending directions of gaps between the adjacent conductor plates is provided in respective gaps on the upper surface 20a of the ceramic substrate 20 between the adjacent conductor plates. The extending direction of the gap is a direction orthogonal to the direction of the gap corresponding to the distance between the respective edges the conductor plates facing each other. The separating insulating member 25 is, for example, an insulating member having a rectangular cross section as illustrated in FIG. 3. The cross section is a cross section taken along a plane perpendicular to the extending direction of the separating insulating member 25. Details of the separating insulating member 25 will be described later with reference to FIG. 3.

A first semiconductor element 31 is arranged on the upper surface of the first conductor plate 22 with a bonding material S interposed therebetween. A second semiconductor element 32 is arranged on the upper surface of the second conductor plate 23 with a bonding material S interposed therebetween. The bonding material S may be any material as long as it has conductivity, and may be, for example, solder or a sintered metal material. The first semiconductor element 31 and the second semiconductor element 32 are formed in a rectangular shape in a plan view using a semiconductor substrate such as silicon (Si).

The first semiconductor element 31 and the second semiconductor element 32 may be a wide bandgap semiconductor device made of a wide bandgap semiconductor substrate formed of silicon carbide (SiC), gallium nitride (GaN), diamond, or the like, instead of silicon described above.

Switching elements such as IGBTs (Insulated Gate Bipolar Transistors), power MOSFETs (Metal Oxide Semiconductor Field Effect Transistors), and diodes such as FWDs (Free Wheeling Diodes) may be used for the first semiconductor element 31 and the second semiconductor element 32.

In this embodiment, the first semiconductor element 31 and the second semiconductor element 32 are an RC (Reverse Conducting)-IGBT that integrates the functions of an IGBT (Insulated Gate Bipolar Transistor) element and an FWD (Free Wheeling Diode) element. For example, the first semiconductor element 31 is a low voltage side semiconductor element and the second semiconductor element 32 is a high voltage side semiconductor element.

The semiconductor element arranged on the upper surface of the multilayer substrate 2 is not limited to this, and may be configured by combining the switching elements, diodes, etc. described above. For example, the IGBT element and the FWD element may be configured separately. Also, RB (Reverse Blocking)-IGBT or the like having a sufficient breakdown voltage against reverse bias may be used as the semiconductor element. Also, the shape, the number of arrangement, the position of arrangement, etc., of the semiconductor elements can be changed as appropriate.

The first semiconductor element 31 and the second semiconductor element 32 have an upper surface and a lower surface that are parallel to the XY plane, and electrodes (not shown) are formed on each surface. For example, the first semiconductor element 31 and the second semiconductor element 32 each have a main electrode and a gate electrode formed on the upper surface, and also a main electrode formed on the lower surface.

When the first semiconductor element 31 is a MOSFET element, the main electrode on the upper surface side may be called the source electrode, and the main electrode on the lower surface side may be called the drain electrode. Further, when the first semiconductor element 31 is an IGBT element, the main electrode on the upper surface side may be called an emitter electrode, and the main electrode on the lower surface side may be called a collector electrode. Moreover, regardless of the type of element, the gate electrode may be called the gate electrode as it is. Further, an auxiliary electrode may be provided on the upper surface of the first semiconductor element 31 in addition to the main electrode. For example, the auxiliary electrode may be an auxiliary source electrode or an auxiliary emitter electrode that is electrically connected to the main electrode on the upper surface side and serves as a reference potential with respect to the gate potential. Also, the auxiliary electrode may be a temperature sensing electrode that is electrically connected to a temperature sensing section to measure the temperature of the semiconductor element. Such electrodes (main electrode, gate electrode and auxiliary electrode) formed on the upper surface of the first semiconductor element 31 may be collectively called upper surface electrodes, and electrodes formed on the lower surface of the second semiconductor element 32 may be collectively called lower surface electrodes. Further, among the top electrodes, the gate electrode and the auxiliary electrode may be called control electrodes.

In this embodiment, the main electrode is an electrode through which a main current flows, and the gate electrode is an electrode for controlling a gate for turning on and off the main current. The configuration of each electrode described above for the first semiconductor element 31 can also be applied to the second semiconductor element 32.

Further, the first semiconductor element 31 and the second semiconductor element 32 in the present embodiment may be so-called vertical switching elements in which functional elements such as transistors are formed on a semiconductor substrate in the thickness direction. Also, a horizontal switching element in which these functional elements are formed in the plane direction may be used.

The main electrode on the lower surface side of the first semiconductor element 31 is electrically connected to the first conductor plate 22 by a bonding material S. The first conductor plate 22 is electrically connected to a first terminal (input electrode) 61 provided on the case 11 through a first metal wiring plate 41. The main electrode on the upper surface side of the first semiconductor element 31 is electrically connected to the third conductor plate 24 through the second metal wiring plate 42. The third conductor plate 24 is electrically connected to a second terminal (low potential side electrode) 62 provided on the case 11 through the third metal wiring plate 43. The control electrodes (gate electrode and auxiliary electrode) (not shown) provided on the upper surface side of the first semiconductor element 31 are electrically connected to control terminals (not shown) provided on the case 11 by, for example, bonding wires (not shown).

The main electrode on the lower surface side of the second semiconductor element 32 is electrically connected to the second conductor plate 23 by a bonding material (not shown). The second conductor plate 23 is electrically connected to a third terminal (high potential side electrode) 63 provided on the case 11 by a fifth metal wiring plate 45. The main electrode on the upper surface side of the second semiconductor element 32 is electrically connected to the first conductor plate 22 by a fourth metal wiring plate 44. The control electrodes (gate electrode and auxiliary electrode) (not shown) provided on the upper surface side of the second semiconductor element 32 are electrically connected to control terminals (not shown) provided on the case 11 by, for example, bonding wires (not shown).

The first metal wiring plate 41 to the fifth metal wiring plate 45 constitute main current wiring members and function as part of the main current paths (main current paths) flowing through the semiconductor module 1. These metal wiring plates are composed of plate-like bodies having an upper surface and a lower surface. The thickness of each metal wiring plate may be, for example, 0.1 mm or more and 2.5 mm or less. Each metal wiring plate is made of metal such as copper, copper alloy, aluminum alloy, iron alloy, or the like. Each metal wiring plate is formed into a predetermined shape by, for example, press working. Each metal wiring plate becomes an electrically independent wiring member by forming a plurality of lead portions of a lead frame into a predetermined shape by pressing and separating each lead portion from the frame portion, for example.

The internal space defined by the case 11 is filled with a sealing resin (sealing insulator) 5. The sealing resin 5 may be filled up to the upper end of the case 11. The sealing resin 5 seals the conductor plates 22 to 24, the semiconductor elements 31 and 32, the metal wiring plates 41 to 45, and the bonding wires (not shown) of the multilayer substrate 2.

The sealing resin 5 may be composed of, for example, a thermosetting resin. The sealing resin 5 preferably contains at least one of epoxy, silicone, urethane, polyimide, polyamide, and polyamideimide. For the sealing resin 5, for example, an epoxy resin mixed with a filler is suitable from the viewpoint of insulation, heat resistance, and heat dissipation.

Each of the plurality of main terminals for the main current (the first terminal 61, the second terminal 62, and the third terminal 63 in FIG. 1) provided in the case 11 is a plate-shaped elongated body. Each main terminal is embedded in the side wall of the case 11 and has one end extending from the side wall of the case 11 to the internal space and the other end extending from the side wall of the case 11 to the outside. One end of each main terminal is electrically connected to a predetermined main electrode of the semiconductor elements 31 and 32.

A control terminal (not shown) is embedded in the side wall of the case 11 located on the positive side in the Y direction. One end of the control terminal illustrated in FIG. 1 is exposed in a plane facing upward (positive side in the Z direction) in the internal space of the case 11, and the other end is exposed on the upper surface of the case 11. One end of each control terminal is electrically connected to predetermined control electrodes of the semiconductor elements 31 and 32 via wiring members such as bonding wires (not shown).

The main terminals and control terminals provided on the case 11 are made of metal such as copper, copper alloy, aluminum alloy, iron alloy, etc., and have a predetermined electrical conductivity and a predetermined mechanical strength. The shape, the number of the main terminals and the control terminals, the arrangement locations, etc., are not limited to these, and can be changed as appropriate.

In the semiconductor module 1 of the present embodiment, as described above, the separating insulating member 25 extending along the extending direction of the gap is arranged in the gap between the conductor plates on the upper surface 20a of the ceramic substrate 20. The separating insulating member 25 in the semiconductor module 1 illustrated in FIG. 1 includes a first separation portion 25a, a second separation portion 25b, and a third separation portion 25c. The first separation portion 25a is located in the gap between the first conductor plate 22 and the second conductor plate 23 and extends in the extending direction (Y direction) of the gap. The second separation portion 25b is located in the gap between the first conductor plate 22 and the third conductor plate 24, extends in the extending direction (X direction) of the gap, and has one end connected to the first separation portion 25a. The third separation portion 25c is located in the gap between the second conductor plate 23 and the third conductor plate 24, extends in the extending direction (Y direction) of the gap, and has one end connected to the second separation portion 25b.

The separating insulating member 25 is adhered to the upper surface 20a of the ceramic substrate 20 with an adhesive 26. As the adhesive 26, an insulating resin having a higher adhesion to the upper surface 20a of the ceramic substrate 20 than the adhesion between the sealing resin 5 and the upper surface 20a of the ceramic substrate 20 is used. If the sealing resin 5 is an epoxy resin, the adhesive 26 can be, for example, an RTV (Room Temperature Vulcanizing) silicone adhesive. Note that the adhesive 26 is not limited to the specific insulating resin.

Each separation portion of the separating insulating member 25 is arranged so as to divide the area where the upper surface 20a of the ceramic substrate 20 and the sealing resin 5 are in close contact with each other in the direction of the gap G (the Y direction in FIG. 3) in the gap between the conductor plates. The distance (gap) from one conductor plate to the separation portion and the distance from the other conductor plate to the separation portion may be the same or substantially the same as illustrated in FIG. 3, or may be different (i.e., biased). For example, the second separation portion 25b of the separating insulating member 25 arranged in the gap between the first conductor plate 22 and the third conductor plate 24 illustrated in FIG. 3 may be closer to the side of the first conductor plate 22, or the side of the third conductor plate 24, instead of at the central position shown in FIG. 3.

The separating insulating member 25 is made of an insulating material such as silicon nitride, alumina, aluminum nitride, or the like. The separating insulating member 25 may be an integral body having the first separation portion 25a, the second separation portion 25b, and the third separation portion 25c integrally formed. Alternatively, as will be explained with reference to FIG. 7 below, the separating insulating member 25 may be formed by separately forming the first separation portion 25a, the second separation portion 25b, and the third separation portion 25c and assembling them, for example. Further, the shape of the separating insulating member 25 is not limited to the plan view shape illustrated in FIG. 1, and may be appropriately changed depending on the arrangement of the conductor plates on the upper surface 20a of the ceramic substrate 20. In addition, two or more of the separating insulating members 25 may be arranged on the upper surface 20a of the ceramic substrate 20 according to the arrangement of the conductor plates.

The separating insulating member 25 is formed so that each separating portion has a rectangular cross section, for example. FIG. 3 illustrates a cross section (a cross section parallel to the YZ plane) of the second separation portion 25b extending in the X direction. The width W in the cross section of each separation portion is not limited to a specific width, and can be appropriately set according to the distance (gap G) between the conductor plates in which the separation portion is arranged. For example, when the gap G between the first conductor plate 22 and the third conductor plate 24 illustrated in FIG. 3 is approximately 1 mm to 2 mm, the width W of the second separation portion can be set to about 0.5 mm. The width W of each separation portion of the separating insulating member 25 may be the same, or may have two or three variations depending on the distance (gap G) between the conductor plates where each separation portion is arranged.

The height H in the cross section of each separation portion is not limited to a specific height, and is appropriately set according to the arrangement of semiconductor elements, metal wiring boards, etc., around the gap G in which the separation portion is arranged. For example, in FIG. 3, the distance (height) from the upper surface 20a of the ceramics substrate 20 to the upper surface of the separating insulating member 25 when the ceramics substrate 20 is adhered to the ceramics substrate 20 with the adhesive 26 is substantially the same as the distance from the upper surface 20a of the ceramics substrate 20 to the upper surfaces of the first conductor plate 22 and the third conductor plate 24 (thickness T of the conductor plate). However, the distance from the upper surface 20a of the ceramic substrate 20 to the upper surface of the separating insulating member 25 may be greater or smaller than the distance corresponding to the thickness T of the conductor plates. In the process of arranging the semiconductor elements 31 and 32 on the upper surface of the multilayer substrate 2 and performing wiring connections using the metal wiring plates 41 to 45 and bonding wires, etc., various parts would be handled efficiently if they do not come into contact with the separating insulating member 25. For this reason, the distance from the upper surface 20a of the ceramic substrate 20 to the upper surface of the separating insulating member 25 is preferably substantially equal to or shorter than the distance corresponding to the thickness T of the conductor plates. On the other hand, from the viewpoint of increasing the creepage distance, which will be described later with reference to FIG. 6, the distance from the upper surface 20a of the ceramic substrate 20 to the upper surface of the separating insulating member 25 is preferably greater than the distance corresponding to the thickness T of the conductor plates.

Before explaining the effect of providing the separating insulating member 25 described above, first, an example of peeling of the sealing resin that can occur in a conventional semiconductor module (semiconductor device) in which the separating insulating member 25 is not provided will be explained.

Figure 4:
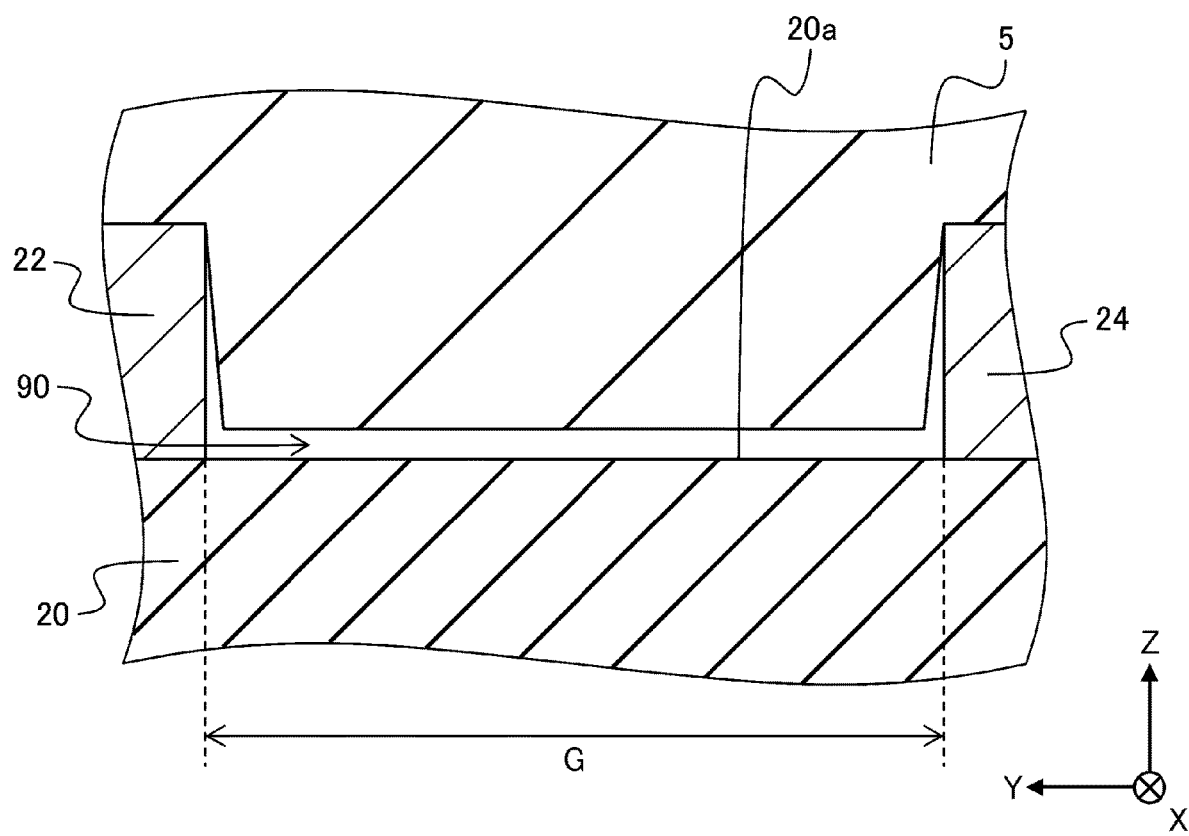
FIG. 4 is a partial cross-sectional view explaining an example of peeling that can occur in a conventional semiconductor module.

FIG. 4 is a partial cross-sectional view explaining an example of peeling that can occur in a conventional semiconductor module. FIG. 4 shows an enlarged cross section parallel to the YZ plane showing the gap between the first conductor plate 22 and the third conductor plate 24 of the semiconductor module 1 illustrated in FIGS. 1-3, but without the separating insulating member 25.

In the conventional semiconductor module, the gap between the first conductor plate 22 and the third conductor plate 24 on the upper surface 20a of the ceramic substrate 20 is wholly in close contact with the sealing resin 5. Generally, epoxy resin with high insulation is used for the sealing resin 5. However, the epoxy resin used as the sealing resin 5 does not necessarily have high adhesion to the upper surface 20a of the ceramics substrate 20. For this reason, thermal stress caused by heat generated by the semiconductor element during operation causes bending deformation in the ceramic substrate 20, for example, and peeling of the sealing resin 5 occurs in the gap between the conductor plates of the ceramic substrate 20. When there is insufficient adhesion between the sealing resin 5 and the ceramic substrate 20, as illustrated in FIG. 4, the peeling of the sealing resin 5 can expand to the entirety of the gap between the conductor plates. As a result, a space 90 may extend from the first conductor plate 22 to the third conductor plate 24. If such a space is created, the insulation between the conductor plates by the sealing resin 5 will be broken, resulting in malfunction. Therefore, in the conventional semiconductor module, the distance (creepage distance) between the conductor plates along the space 90 from the first conductor plate 22 to the third conductor plate 24 is set to be larger than a predetermined value according to the operation of the semiconductor module. This way, the insulation between the conductor plates is ensured even when the sealing resin 5 is peeled off. Therefore, in the conventional semiconductor module, it is difficult to further shorten the distance (gap G) between the conductor plates and to further miniaturize the semiconductor module.

Figure 5:
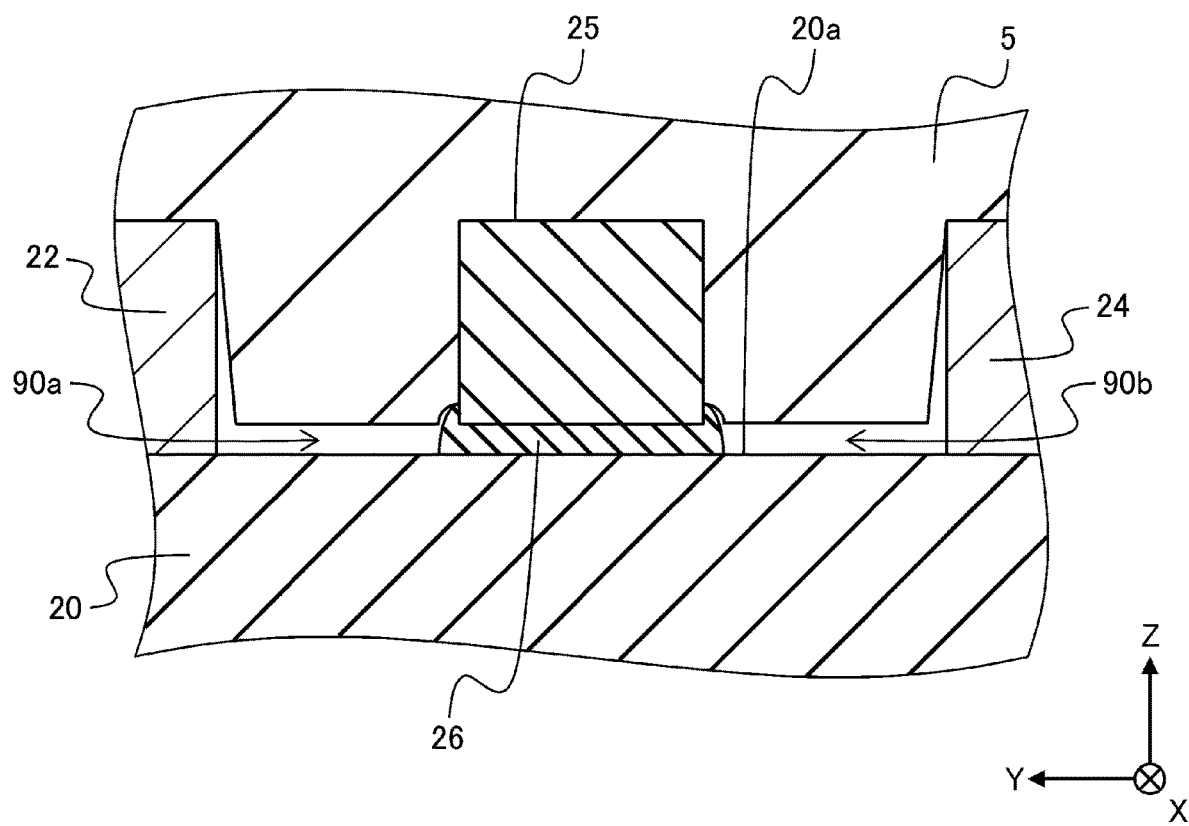
FIG. 5 is a partial cross-sectional view explaining a first example of delamination that can occur in the semiconductor module of the embodiment.
Figure 6:
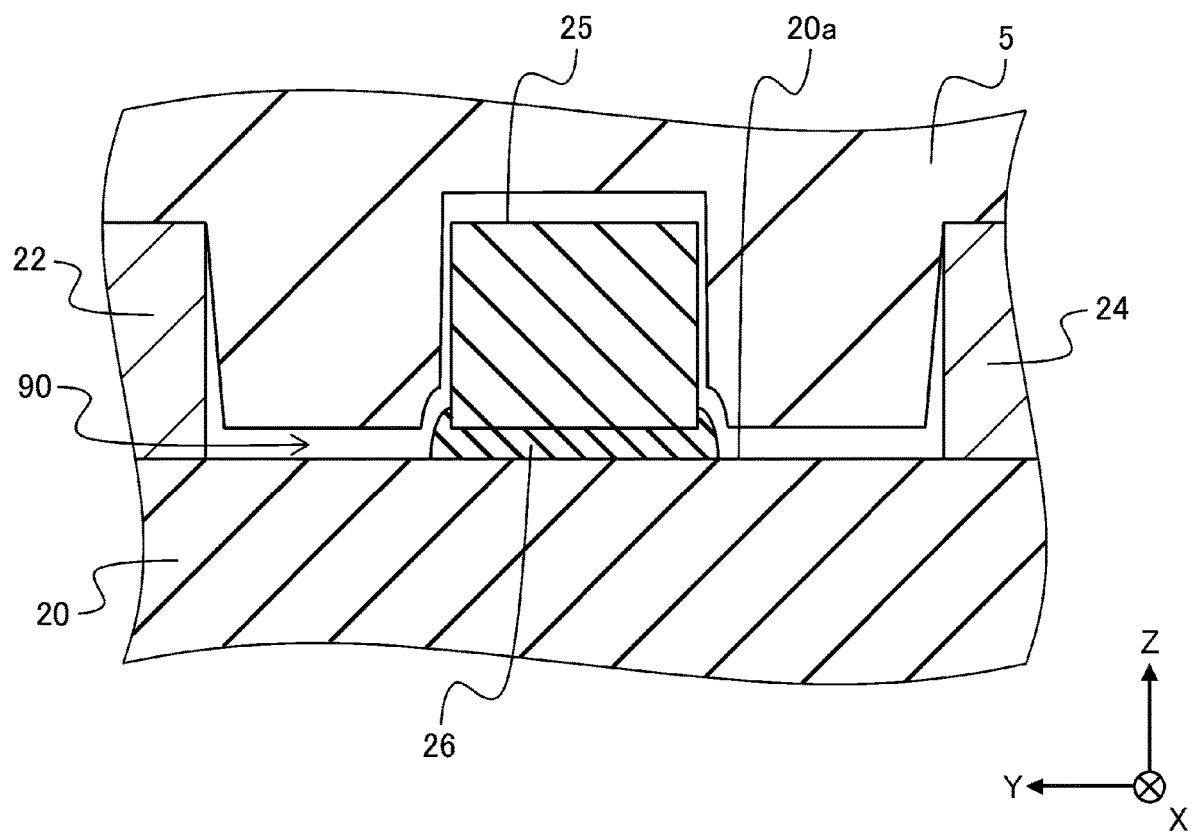
FIG. 6 is a partial cross-sectional view explaining a second example of delamination that can occur in the semiconductor module of the embodiment.

FIG. 5 is a partial cross-sectional view illustrating a first example of delamination that can occur in the semiconductor module of the present embodiment. FIG. 6 is a partial cross-sectional view illustrating a second example of delamination that can occur in the semiconductor module of the present embodiment. FIGS. 5 and 6 show cross sections of the semiconductor module illustrated in FIG. 4 in which the separating insulating member 25 is provided in the gap between the first conductor plate 22 and the third conductor plate 24.

In the semiconductor module 1 of the present embodiment, the separating insulating member 25 is adhered to the gap between the conductor plates on the upper surface 20a of the ceramic substrate 20 by the adhesive 26 having a higher adhesion (adhesive strength) with respect to the ceramic substrate 20 than the sealing resin 5. For this reason, as illustrated in FIG. 5, when the sealing resin 5 is peeled off from the ceramic substrate 20 in the gap portion between the separating insulating member 25 and the first conductor plate 22 and in the gap between the separating insulating member 25 and the third conductor plate 24 due to thermal stress, for example, the progress of peeling at each gap is blocked by the separating insulating member 25 and the adhesive 26. As illustrated in FIG. 1, the separating insulating member 25 extends in the gap between the first conductor plate 22 and the third conductor plate 24 along the extending direction (Y direction) of the gap. Therefore, the space 90a formed in the gap between the first conductor plate 22 and the separating insulating member 25 and the space 90b formed in the gap between the third conductor plate 24 and the separating insulating member 25 are not communicated with each other, and therefore, it is possible to prevent the space from extending from the first conductor plate 22 to the third conductor plate 24. Therefore, in the semiconductor module 1 of the present embodiment, the separating insulating member 25 can ensure the insulation between the conductor plates even if the sealing resin 5 is peeled off from the ceramic substrate 20. Therefore, in the semiconductor module 1 of the present embodiment, the distance between the conductor plates can be further shortened, and the semiconductor module can be further miniaturized.

In the semiconductor module 1 of the present embodiment, when stress is repeatedly applied, or when a larger stress concentrates around the separating insulating member 25, as illustrated in FIG. 6, the interface between the sealing resin 5 and the separating insulating member 25 may peel off, creating a space 90 extending from the first conductor plate 22 to the third conductor plate 24. However, the distance (creepage distance) along the space 90 in this case is longer than the distance (gap G) between the first conductor plate 22 and the third conductor plate 24 by a distance that is about 2 times the height of the separating insulating member 25. Therefore, even if a space 90 extending from the first conductor plate 22 to the third conductor plate 24 is generated due to peeling of the sealing resin 5, insulation between the conductor plates is maintained by the creepage distance longer than the gap G.

Furthermore, in the semiconductor module 1 of the present embodiment, a section is provided between the separating insulating member 25 and the conductor plate, in which the sealing resin 5 is in close contact with the ceramic substrate 20. That is, since the insulating material with high insulation used as the sealing resin 5 is present in the gap between the conductor plates, the insulation between the conductor plates can be ensured more reliably when the gap between the conductor plates is narrowed.

Figure 7:
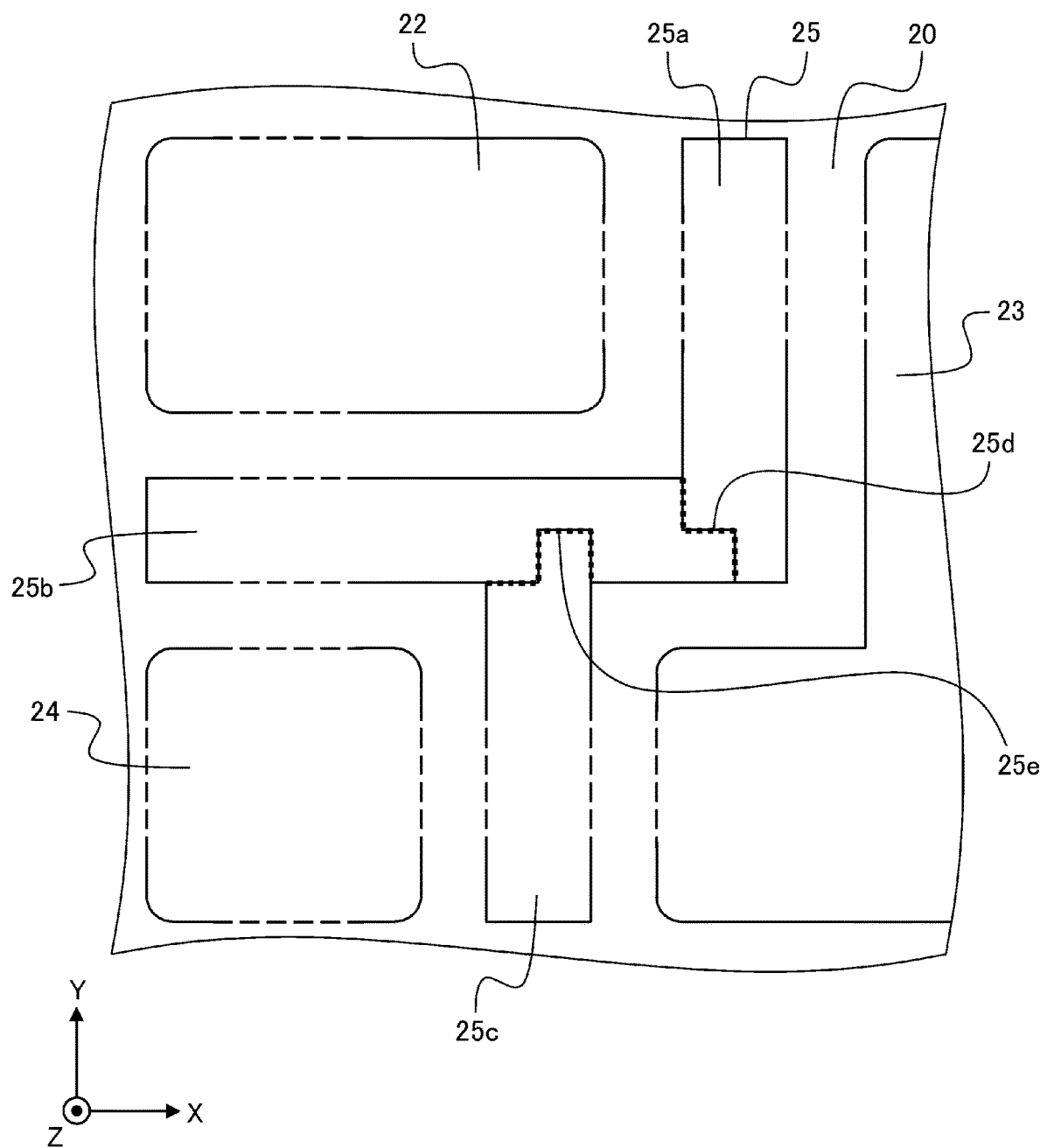
FIG. 7 is a partial top view illustrating a first modification of the separating insulating member.

FIG. 7 is a partial top view for explaining a first modification of the separating insulating member. FIG. 7 shows an enlarged portion of the modification of the separating insulation member 25 illustrated in FIG. 1 of the first modification.

The separating insulating member 25 described above with reference to FIG. 1 is a single piece having the second separation portion 25b connected to the first separation portion 25a and the third separation portion 25c connected to the second separation portion 25b. However, when the width W in the cross section of each separation portion is 1 mm or less and the length in the extending direction of each separation portion is several millimeters to several centimeter, it may be difficult to handle the separating insulating member 25 having a plurality of branched separation portions and adhere it to the gaps between the conductor plates. For this reason, the separating insulating member 25 may be formed by combining (bonding) a plurality of separation portions.

In FIG. 7, the first separation portion 25a, the second separation portion 25b, and the third separation portion 25c of the separation insulating member 25 illustrated in FIG. 1 are formed as separate separation members, and FIG. 7 shows a configuration example of connection portions between the separate separation members. The connecting portion 25d between the first separation portion 25a and the second separation portion 25b is not a single plane parallel to the cross section of each separation portion, but has a stepped shape in a plan view having a face parallel to the cross section (XZ plane) of the first separation portion 25a and a face parallel to the cross section (YZ plane) of the second separation portion 25b. Similarly, the connecting portion 25e between the second separation portion 25b and the third separation portion 25c is not in a single plane parallel to the cross section of each separation portion, but has a stepped shape in a plan view having a face parallel to the cross section (YZ plane) of the second separation portion 25b and a face parallel to the cross section (XZ plane) of the third separation portion 25c.

In this way, by making the connecting portion of the two separation portions have a stepped shape in a plan view, it becomes easier to align each separation portion with the other separation portion when adhering the respective separation portions. In addition, by making the connecting portion of the two separation portions have a stepped shape in a plan view, the creepage distance when there is a space from one conductor plate to the other conductor plate is made longer as compared to the creepage distance when a space is created in the case where the connecting portion is a single plane (the connecting surface is a straight line in a plan view), making it easier to ensure insulation.

In addition, when forming the separating insulating member 25 by combining a plurality of separation portions provided separately, the configuration of the connecting portions of the separation portions is not limited to the stepped shape in a plan view as illustrated in FIG. 7 above, and may be configured by applying or adapting known jointing technique or the like in the field of woodworking, for example. Also, each of the plurality of separately provided separation portions may include, for example, two or more smaller separation portions for forming one separation portion extending in the extending direction in the gap. For example, the first separation portion 25a of the separating insulating member 25 is not limited to a single insulating member, and may be formed by arranging and integrating a plurality of smaller separated portions in the extending direction of the gap. In this way, for example, by combining several types of separation portions with different lengths, it is possible to form various separating insulation members 25 having different shapes and dimensions when viewed from the top, and it is possible to improve the manufacturing efficiency and reduce the manufacturing cost as compared with the case of forming the dedicated separating insulating member 25 in accordance with the layout of the conductor plates for each semiconductor module 1.

Figure 8A:
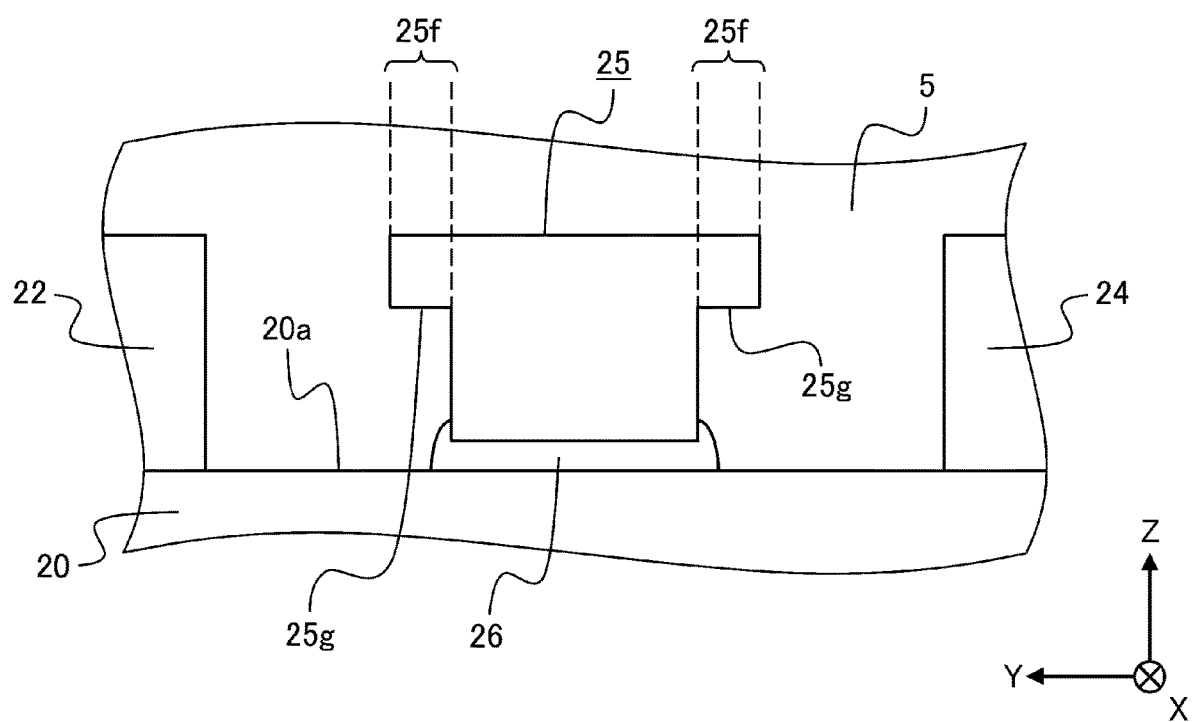
FIG. 8A is a partial cross-sectional view illustrating a second modification of the separating insulating member.
Figure 8B:
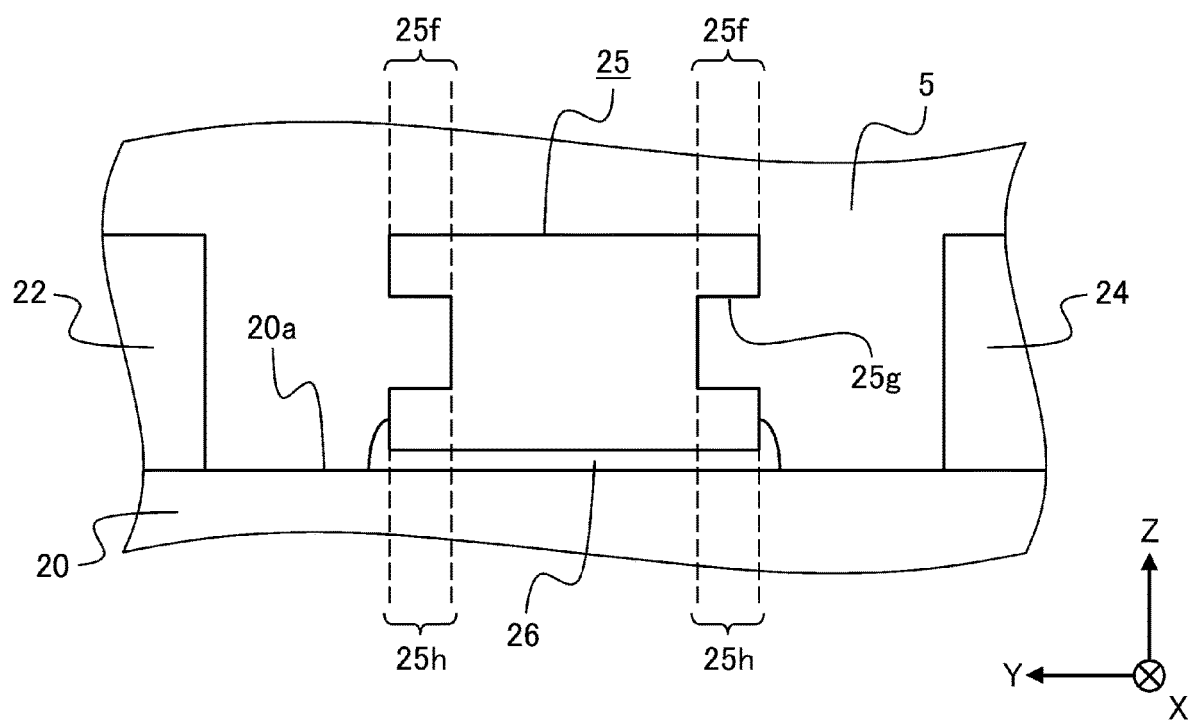
FIG. 8B is a partial cross-sectional view illustrating a third modification of the separating insulating member.
Figure 8C:
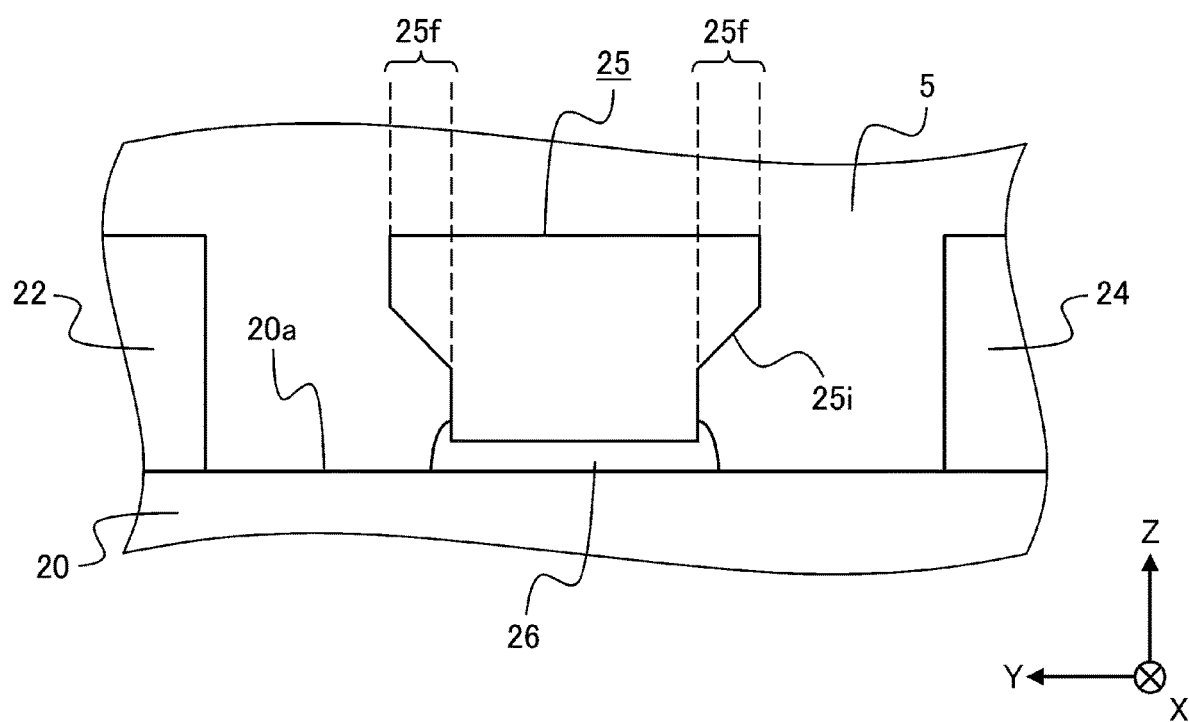
FIG. 8C is a partial cross-sectional view illustrating a fourth modification of the separating insulating member.

FIG. 8A is a partial cross-sectional view illustrating a second modification of the separating insulating member. FIG. 8B is a partial cross-sectional view illustrating a third modification of the separating insulating member. FIG. 8C is a partial cross-sectional view illustrating a fourth modification of the separating insulating member. FIGS. 8A to 8C show modifications of the shape of the cross section of the separating insulating member 25 in the same cross section as the partial cross section of FIG. 5. The cross-sectional views of FIGS. 8A to 8C omit hatching indicating that they are cross-sections of an object (rigid body).

The cross section of the separating insulating member 25 illustrated in FIG. 8A has a T-shaped cross section including fin portions 25f projecting in the direction of the gap between the conductor plates (that is, the direction toward the conductor plate in the cross section) on the upper surface side of the separating insulating member 25. The fin portion 25f has a surface 25g facing the upper surface 20a of the ceramic substrate 20. Therefore, when the sealing resin 5 is separated from the ceramic substrate 20, the displacement of the sealing resin 5 in the direction away from the upper surface 20a of the ceramic substrate 20 is restricted (suppressed) by the surface 25g of the fin portion 25f of the separating insulating member 25, and progress of peeling of the sealing resin 5 can be prevented.

The cross section of the separating insulating member 25 illustrated in FIG. 8B has fin portions 25f that protrude in the direction of the gap between the conductor plates on the upper surface side of the separating insulating member 25, and also has fin portions 25h that protrude in the direction of the gap between the conductor plates on the lower surface side. It therefore has a substantially I-shaped cross-section (or a cross-sectional shape obtained by rotating a substantially H-shaped cross-section by 90 degrees in the cross section). The fin portion 25f on the upper surface side has a surface 25g facing toward the upper surface 20a of the ceramic substrate 20 (negative side in the Z direction). Therefore, when the sealing resin 5 is separated from the ceramic substrate 20, displacement of the sealing resin 5 in the direction away from the upper surface 20a of the ceramic substrate 20 is restricted (suppressed) by the surface 25g of the fin portion 25f on the upper surface side, and the progress of peeling of the sealing resin 5 can be prevented.

In addition, the separating insulating member 25 illustrated in FIG. 8B has the fin portions 25h provided on the lower surface side, so that the area of the lower surface is increased. Therefore, by using the separating insulating member 25 illustrated in FIG. 8B, the bonding area between the separating insulating member 25 and the ceramic substrate 20 is increased, and the adhesion (adhesion strength) is increased. Therefore, the resistance to the force applied to the surface 25g of the fin portion 25f of the separating insulating member 25 from the sealing resin 5, which urges the surface 25g to be displaced in the direction away from the upper surface 20a of the ceramic substrate 20, is increased, and therefore, it is possible to prevent the separating insulating member 25 from being peeled from the ceramic substrate 20.

Furthermore, in the separating insulating member 25 illustrated in FIG. 8B, the sealing resin 5 is filled in the narrowed section between the fin portion 25f on the upper surface side and the fin portion 25h on the lower surface side. For this reason, for example, by using the separating insulating member 25 having the substantially I-shaped cross section illustrated in FIG. 8, the amount of the sealing resin 5 existing between the conductor plates increases, making it easier to increase the insulation between the conductor plates.

The cross section of the separating insulating member 25 illustrated in FIG. 8C is similar to the substantially T-shaped cross section illustrated in FIG. 8A. But a side surface of the fin portion 25f is connected to a side surface on the lower surface side by a taper 25i. Even when such a separating insulating member 25 is used, progress of peeling of the sealing resin 5 can be prevented.

Although the step of sealing the inside of the case 11 with the sealing resin 5 in the manufacturing method of the semiconductor module 1 according to the present embodiment is generally performed under a reduced pressure environment, if there is a surface 25g facing the ceramics substrate 20, as in the case of a fin portion 25f of the separating insulating member 25, there is a possibility that the filling failure of the sealing resin 5 may occur at the corner where the surface 25g and the side surface below the surface 25g are connected. As illustrated in FIG. 8C, by not having the surface 25g facing the ceramic substrate 20, the possibility of insufficient filling of the sealing insulator can be reduced.

Furthermore, although the description with reference to the drawings is omitted, the semiconductor module 1 may have the fin portions 25h only on the lower surface side of the separating insulating member 25 so as to increase adhesion (adhesion strength) between the separating insulating member 25 and the ceramic substrate 20. Moreover, the fin portions 25f and the fin portions 25h may be provided on the separation insulating member 25 over the entire length in the extending direction, or may be provided intermittently. Furthermore, in the semiconductor module 1 according to the present embodiment, instead of bonding the separating insulating member 25 to the ceramic substrate 20 with the adhesive 26, an insulating resin that can be used as the adhesive 26 may be applied or printed onto the upper surface of the ceramic substrate so as to form the separating insulating member 25 that is integral with the adhesive 26.

As described above, the semiconductor device 100 including the semiconductor module 1 of the present embodiment can be applied to a power conversion device such as an inverter for an in-vehicle motor. A vehicle to which the semiconductor device 100 of the present invention is applied will be described with reference to FIG. 9.

Figure 9:
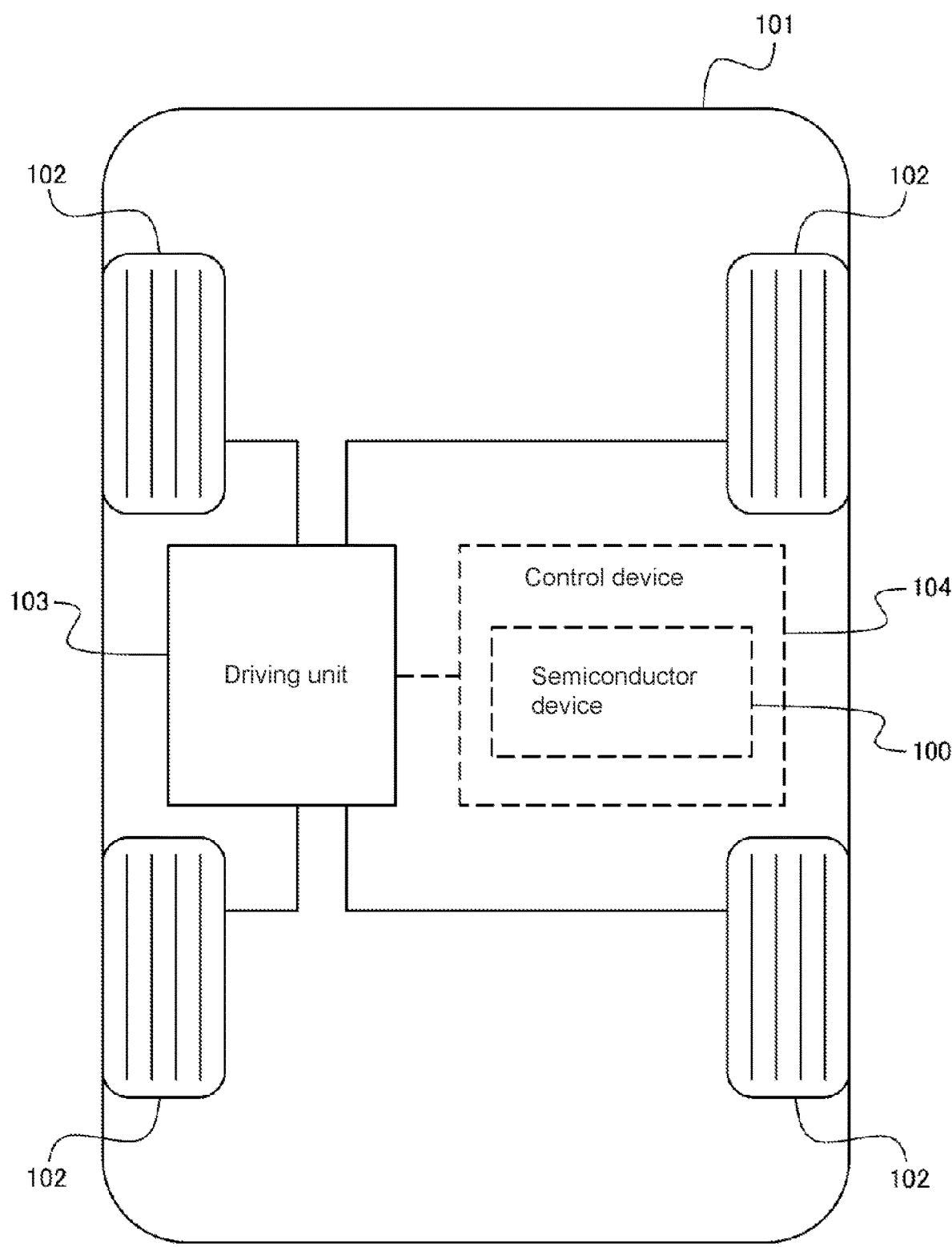
FIG. 9 is a schematic plan view showing an example of a vehicle to which the semiconductor device of the present invention is applied.

FIG. 9 is a schematic plan view showing an example of a vehicle to which the semiconductor device according to the present invention is applied. A vehicle 101 shown in FIG. 9 is configured as, for example, a four-wheeled vehicle having four wheels 102. The vehicle 101 may be, for example, an electric vehicle whose wheels are driven by a motor or the like, or a hybrid vehicle using power from an internal combustion engine in addition to the motor.

The vehicle 101 includes a driving unit 103 that applies power to the wheels 102 and a control device 104 that controls the driving unit 103. The driving unit 103 may be composed of, for example, at least one of an engine, a motor, and a hybrid of an engine and a motor.

The control device 104 carries out control (for example, power control) of the driving unit 103 described above. The control device 104 includes the semiconductor device 100 described above. The semiconductor device 100 may be configured to implement power control for the driving unit 103.

In the above embodiments, the number and locations of the semiconductor elements are not limited to the above configuration, and can be changed as appropriate.

Also, in the above embodiments, the number and layout of circuit boards are not limited to the above configuration, and can be changed as appropriate.

Further, in the above-described embodiments, the multilayer substrate 2 and the semiconductor elements are configured to be rectangular or square in a plan view, but the configuration is not limited to this. These parts may be formed in polygonal shapes other than those described above.

In addition, although the present embodiment and modifications have been described, other embodiments may be obtained by combining the above embodiments and modifications in whole or in part.

In addition, the present invention is not limited to the above-described embodiments and modifications, and may be variously changed, replaced, and modified within the scope of the technical idea. Furthermore, if the technical idea can be realized in another way due to advances in technology or another derived technology, such schemes may be used for implementation. Therefore, the claims cover all implementations that may fall within the scope of the technical concept.

As described above, the present invention has the effect of ensuring insulation between adjacent conductor patterns on the surface of a ceramic substrate, and particularly useful for industrial or electrical semiconductor modules, semiconductor devices, and vehicles.

As described above, the semiconductor device and semiconductor circuit device according to the present invention are suitable for use in power semiconductor devices used in power converters such as inverters, power supplies for various types of industrial machinery, and the like.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor module, comprising:
    a wiring board including a ceramic substrate and conductor patterns on a first surface of the ceramic substrate;
    a semiconductor element arranged on at least one of the conductor patterns on the first surface of the ceramic substrate;
    a sealing insulator that seals the wiring board and the semiconductor element; and
    an insulating member adhered on the first surface of the ceramic substrate in a gap between the conductor patterns that are adjacent to each other, the insulating member extending in an extending direction of the gap and dividing an area in the gap where the sealing insulator fills the gap so that the insulating member is laterally separate from respective edges of the conductor patterns adjacent to each other.

2. The semiconductor module according to claim 1, wherein said insulating member is adhered to said ceramic substrate with an insulating adhesive.

3. The semiconductor module according to claim 1, wherein said insulating member has a fin portion projecting laterally at or adjacent to a top portion of the insulating member that is at a far end from the first surface of the ceramic substrate.

4. The insulating member according to claim 1, wherein said insulating member has a fin portion protruding laterally at or adjacent to a bottom portion of the insulating member that is attached to the first surface of the ceramic substrate.

5. The insulating member according to claim 4, wherein said insulating member has a fin portion protruding laterally at or adjacent to a bottom portion of the insulating member that is attached to the first surface of the ceramic substrate.

6. The semiconductor module according to claim 1, wherein said insulating member is a single member.

7. The semiconductor module according to claim 1, wherein said insulating member is formed by combining a plurality of separately provided separation portions.

8. The semiconductor module according to claim 7,
    wherein the plurality of separately provided separation portions include a first separation portion extending in a first direction and a second separation portion extending from the first separation portion in a second direction different from the first direction, and
    wherein an interface line of a connection portion between the first separation portion and the second separation portion on the first surface of the ceramic substrate is longer than a straight line connecting both ends of the interface line of the connection portion.

9. The semiconductor module according to claim 8, wherein the interface line has a stepped shape having a straight segment extending in the first direction and a straight segment extending in the second direction.

10. The semiconductor module according to claim 1, wherein on the first surface of the ceramic substrate, a height of the insulating member is smaller than a height of the conductor patterns.

11. A semiconductor device, comprising:
    the semiconductor module as set forth in claim 1; and
    a cooler provided on a second surface of the ceramic substrate that is opposite to the first surface.

12. A vehicle including the semiconductor module as set forth in claim 1.

13. A vehicle including the semiconductor device as set forth in claim 11.

* * * * *